United States Patent
Li

(10) Patent No.: US 6,476,905 B1
(45) Date of Patent: Nov. 5, 2002

(54) STEP AND SCAN EXPOSURE SYSTEM EQUIPPED WITH A PLURALITY OF ATTENUATOR BLADES FOR EXPOSURE CONTROL

(75) Inventor: Meng Chun Li, Taipei (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 09/488,159

(22) Filed: Jan. 20, 2000

(51) Int. Cl.[7] .................. G03B 27/72; G03B 27/42; G03B 27/54
(52) U.S. Cl. ..................... 355/71; 355/53; 355/67
(58) Field of Search ................ 355/53, 67–71, 355/77; 250/492.23

(56) References Cited

U.S. PATENT DOCUMENTS 4,970,546 A * 11/1990 Suzuki et al. ............ 355/53
5,300,967 A * 4/1994 Kamon ..................... 353/97
5,712,698 A * 1/1998 Poschenrieder et al. ...... 355/71

* cited by examiner

*Primary Examiner*—Russell Adams
*Assistant Examiner*—Hung Henry Nguyen
(74) *Attorney, Agent, or Firm*—Tung & Associates

(57) ABSTRACT

A step and scan exposure system that is equipped with a plurality of attenuator blades for achieving exposure control in a photolithographic scanner is described. In the exposure system, at least two attenuator blades each equipped with at least three attenuators are utilized for producing an attenuated optical beam from an optical source such as from a mercury lamp. By using a suitable number of attenuator blades and a suitable number of attenuators in each blade, any combination of light transmission attenuated can be provided. For instance, when three attenuators are provided in each of three attenuator blades, a light transmission can be controlled between 10% and 90% at 10% increment between each two adjacent attenuators. By using the present invention novel exposure system with the multiple number of attenuator blades, the throughput of a photolithographic process is not significantly sacrificed since the scanning speed of the wafer stage need not be significantly reduced in order to produce the desirable exposure.

13 Claims, 2 Drawing Sheets

STEP AND SCAN EXPOSURE SYSTEM EQUIPPED WITH A PLURALITY OF ATTENUATOR BLADES FOR EXPOSURE CONTROL

FIELD OF THE INVENTION

The present invention generally relates to a photolithographic scanner that has an improved variable attenuator and more particularly, relates to a step and scan exposure system for a photolithographic process that is equipped with a plurality of attenuator blades for exposure control that is capable of controlling exposure at 10% increment in light transmission.

BACKGROUND OF THE INVENTION

Modern fabrication processes for producing semiconductor devices, such as integrated circuits, have long employed photolithography for transferring circuit patterns onto a semiconductor substrate, such as a wafer. In general, photolithography involves the performance of a sequence of process steps, including coating a semiconductor wafer with a resist layer, exposing the coated wafer to a patterned light source, developing the resist layer, processing the semiconductor wafer through the developed resist layer, and removing the resist layer. An optical photolithography scanner apparatus, sometimes referred to as a "step and scan" or "scanner", is typically used to expose the resist layer. An image of each later of an IC die is formed on the stepper and a reduced image thereof is projected onto a portion of the resist layer covering the semiconductor wafer. Specifically, the reticle patterns are transferred to the wafer by scanning the patterns through a narrow illumination slit.

When numerous IC's are to be fabricated from a single wafer, a mask used in the fabrication of any one IC is also used in the fabrication of the other IC's from the wafer. This is accomplished by using the scanner to scan the wafer under an optical system which includes the mask or reticle. At each step, the photoresist is exposed to the optical system, typically with ultraviolet light, to form a serial image of the mask on the layer of photoresist. The wafer is then removed from the stepper and the image is developed. At that point, the wafer is etched to remove portions of the underlying film, following which the wafer is ready for the next stage of processing, which might include for example, ion implantation, deposition or other types of etching processes. At a later stage in the fabrication process, the wafer is returned to the scanner for exposure of the wafer to a different mask.

The reticle or mask is composed of a glass substrate, such as quartz, on which there is formed a circuit pattern composed of materials such as chromium which prevents ultraviolet light from transmitting therethrough. The reticle is set in the scanner in order to expose a semiconductor wafer to light, and the circuit pattern formed on the reticle is imaged by the scanner onto the semiconductor substrate.

Semiconductor manufacturing processes are aimed at achieving up to 0.25 micron resolution in a high speed production environment. This goal is being driven by the need to develop competitive device performance and lower manufacturing costs per device. In order to increase the field size and improve critical dimensional control below 0.25 micron resolution, improvements in step and scan technology plays a critical role. Improvements in the area of highly controllable, precise light sources, such as excimer lasers with appropriate dose control are important for solving illumination control problems and achieving exceptionally short exposure times.

In order to more precisely control the dose of light radiation projected on the wafer, the illumination system and scanner slit have, in the past, been provided with an adjustment that allows focusing of the image applied to the wafer. This adjustment system relies on movement and adjustment of mechanical elements, and particularly the displacement of the mechanical slit relative to the illumination source. As a result of the dependency on this mechanical adjustment, repeatable results are not always obtained from batch to batch since adjustment settings may change for a number of reasons. Moreover, the need to perform periodic preventive maintenance on equipment introduces the further possibility that adjustment settings may be inadvertently altered, thus making repeatable, precise dosage control impossible.

Referring initially to FIG. 1 which depicts a conventional photolithography exposure system 10 and related dosage control technique. Radiation in the form of ultraviolet light is produced by a mercury lamp 20 and is focused by a reflector 24 onto a reflecting mirror 26 to produce a beam of light which is sequentially passed through a filter 28, shutter 30, attenuator 32, zoom lens 34, interference filters 36, integrator lens 38 and field lens 40 onto an energy sensor 46 which measures the intensity of the beam. The remainder of the beam is reflected by the mirror 44 as a beam spot 48 which is directed through reticle masking blades 50 defining a slit 51 hence through a reticle or mask (not shown). Radiation in the beam passes through the slit 51 and circuit pattern defining reticle and is focused on a semiconductor wafer (not shown) that is supported on an exposure chuck (not shown) provided with a spot meter for measuring the intensity of the beam focused onto a portion of the wafer.

In the conventional photolithography exposure system 10, the attenuator 32 utilized is generally of a variable type formed on a rotatable blade 12, as shown in FIG. 2. The rotatable attenuator blade 12 is mounted through a center aperture 14 to a shaft 16 which is in turn mounted on a housing member 18 for the photolithographic exposure system 10. The housing member 18 further includes an optical port 22 for the ultraviolet light to go therethrough. In the conventional attenuator blade 12 shown in FIG. 2, the attenuator blade 12 is equipped with 3 attenuators 52, 54 and 56. The attenuators 52, 54 and 56 are each individually formed and then mounted in the attenuator blade 12. The attenuator 52 is formed with medium-sized apertures to allow 50% light transmission, the attenuator 54 is formed with large-sized apertures to allow 75% light transmission, while the attenuator 56 is formed with small-sized apertures to allow only 25% light transmission. By rotating the attenuator blade 12, a suitable attenuator selected from 52, 54 and 56 can be used to cover the optical port 22 for achieving an attenuated light beam.

In practice it has been found that the three stages of light transmission control at 25%, 50% and 75% is not adequate in providing desirable exposure control in a photolithographic process. Since a wafer is carried on an exposure chuck and moved on a stage in the step and scan exposure system, the stage speed must also be adjusted in order to compensate for the inadequate light submission control through the variable attenuator 32. In a conventional step and scan exposure system 10, there is a limit within which the stage speed can be adjusted. In order to keep a high throughput of the photolithographic process, the maximum stage speed is preferred. When the conventional variable attenuator blade 12 is utilized, since only three transmission levels are available, the stage speed must be slowed down in order to achieve the desirable exposure thus sacrificing the process throughput. The single attenuator blade design shown in FIG. 2. is therefore inadequate for achieving a desirable exposure control while maintaining maximum stage speed, i.e., maximum throughput, at the same time.

For instance, as shown in FIG. 4, when the 25% transmission attenuator is utilized, in order to achieve a desirable exposure, the scan speed of the wafer stage needs to be slowed down from to 250 mm/sec to about 125 mm/sec. Similarly, when the 50% transmission attenuator is utilized, the scan speed needs to be decreased from 250 mm/sec to about 165 mm/sec. When the 75% transmission attenuator is used, the scan speed needs to be decreased from 250 mm/sec to about 185 mm/sec. As shown in FIG. 4, in the worst case of the 25% transmission attenuator, the scan speed decreases by almost 50% which results in a loss in throughput by almost 50%. It is therefore desirable to have a smaller increment between light transmission in the attenuators such that any substantial drop in scan speed, i.e. thus throughput, can be avoided.

It is therefore an object of the present invention to provide a step and scan exposure system that does not have the drawbacks or shortcomings of the conventional exposure systems.

It is another object of the present invention to provide a step and scan exposure system that is equipped with a plurality of attenuator blades for exposure control.

It is a further object of the present invention to provide a step and scan exposure system that is equipped with at least two attenuator blades each having three attenuators for exposure control in a photolithographic process.

It is another further object of the present invention to provide a step and scan exposure system that is equipped with a plurality of attenuator blades each having three attenuators such that light attenuation of smaller increment can be obtained.

It is still another object of the present invention to provide a step and scan exposure system equipped with three attenuator blades each having three attenuators such that light transmission control at 10% increment can be obtained.

It is yet another object of the present invention to provide a step and scan exposure system equipped with three attenuator blades each having three attenuators such that light transmission between 10% and 90% with 10% increment can be obtained.

It is still another further object of the present invention to provide a photolithographic scanner that is equipped with a variable attenuator wherein a plurality of attenuator blades are co-axially mounted on a scanner body to provide exposure control.

It is yet another further object of the present invention to provide a photolithography scanner that is equipped with a variable attenuator having three attenuator blades each equipped with three attenuators wherein the blades are co-axially mounted on a scanner body for achieving exposure control at increment of 10% light transmission.

SUMMARY OF THE INVENTION

In accordance with the present invention, a step and scan exposure system that is equipped with a plurality of attenuator blades for exposure control is provided.

In a preferred embodiment, a step and scan exposure system equipped with a plurality of attenuator blades for exposure control is provided which includes a main chamber containing an optical source therein and an optical port in a first chamber wall adopted for outputting an optical beam; at least two attenuator blades mounted on the first chamber wall in a passageway of the optical beam each equipped with at least three attenuators for producing an attenuated optical beam exiting the optical port; and a traversing means for mounting an object thereon such that a surface of the object to be exposed traverses under the attenuated optical beam.

In the step and scan exposure system equipped with a plurality of attenuator blades for exposure control at least two attenuator blades are rotatably mounted on the first chamber wall such that an attenuator is rotatably selected for blocking the passageway of the optical beam in the optical port. The at least two attenuator blades have six attenuators for providing an optical transmission between 10% and 90%. The at least two attenuator blades may include three attenuator blades, the three attenuator blades may be equipped with nine attenuators for providing an optical transmission between 10% and 90%, or providing an optical transmission between 10% and 90% at 10% increment. The object traverses under the attenuated optical beam may be a semiconductor wafer. The traversing means may be an X-Y traversing table. The optical source may be a mercury lamp. The motor means for rotating and selecting an attenuator from the plurality of attenuator blades may be co-axially mounted on a common shaft.

The present invention is further directed to a photolithographic scanner that is equipped with a variable attenuator including a scanner body equipped with a light source in the body and an optical port in the top panel for outputting an optical beam from the light source, and a plurality of attenuator blades co-axially mounted through a center aperture in each of the blades to the top panel juxtaposed to the optical port, each of the plurality of attenuator blades has at least two attenuators mounted therein for rotatably engaging the optical port in attenutating a light beam. The photolithographic scanner may further include a sample mounting means for traversing a sample surface under the attenuated optical beam. The light source may be a mercury arc lamp. The plurality of attenuator blades may include two attenuator blades. Each has three attenuators mounted therein for providing an optical transmission between 10% and 90%.

The plurality of attenuator blades may further include three attenuator blades each has three attenuators mounted therein for providing an optical transmission between 10% and 90%, or for providing an optical transmission between 10% and 90% at 10% increment. The at least two attenuators may be formed integrally with each of the plurality of attenuator blades. The photolithographic scanner may further include a motor means for rotatably engaging the at least two attenuators mounted on each of the plurality of blades with optical port to attenuate the optical beam. The sample mounting means may be a X-Y traversing table. The plurality of attenuator blades may be co-axially mounted to the top panel of the scanner body on a common shaft.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a step and scan exposure system that is equipped with a plurality of attenuator blades, for achieving exposure control at a small increment in percent light transmission. In the system, at least two attenuator blades are utilized which are mounted on an exposure system chamber in a passageway of an optical beam supplied by an optical source such as a mercury arc lamp. Each of the attenuator blades includes at least three attenuators mounted therein for attenuating the optical beam passing through the optical port. The system further includes a traversing means for mounting an object thereon such that the surface of the object to be exposed traverses under the attenuated optical beam.

The invention further discusses a photolithographic scanner that is equipped with a variable attenuator which includes a scanner body having a light source in the body and an optical port in a top panel for outputting an optical beam from the light source. The photolithographic scanner further includes a plurality of attenuator blades which are co-axially mounted through a center aperture in each of the blades to the top panel adjacent to the optical port, each of the blades has at least two attenuators mounted therein for rotatably engaging the optical port and attenuating the optical beam. In a preferred embodiment, the plurality of attenuator blades includes three attenuator blades wherein each blade has integrally formed therein three attenuators such that a total of 9 attenuators are provided for attenuating a light beam from 10% transmission to 90% transmission at 10% increment.

One of the major advantages achieved by the present invention novel exposure system is that the light transmission can be precisely controlled at very small increment by the multiplicity of attenuators utilized. As a result, the scanning speed adjustment in the wafer stage is so small that the throughput of the exposure process is substantially unaffected.

Figure 1:
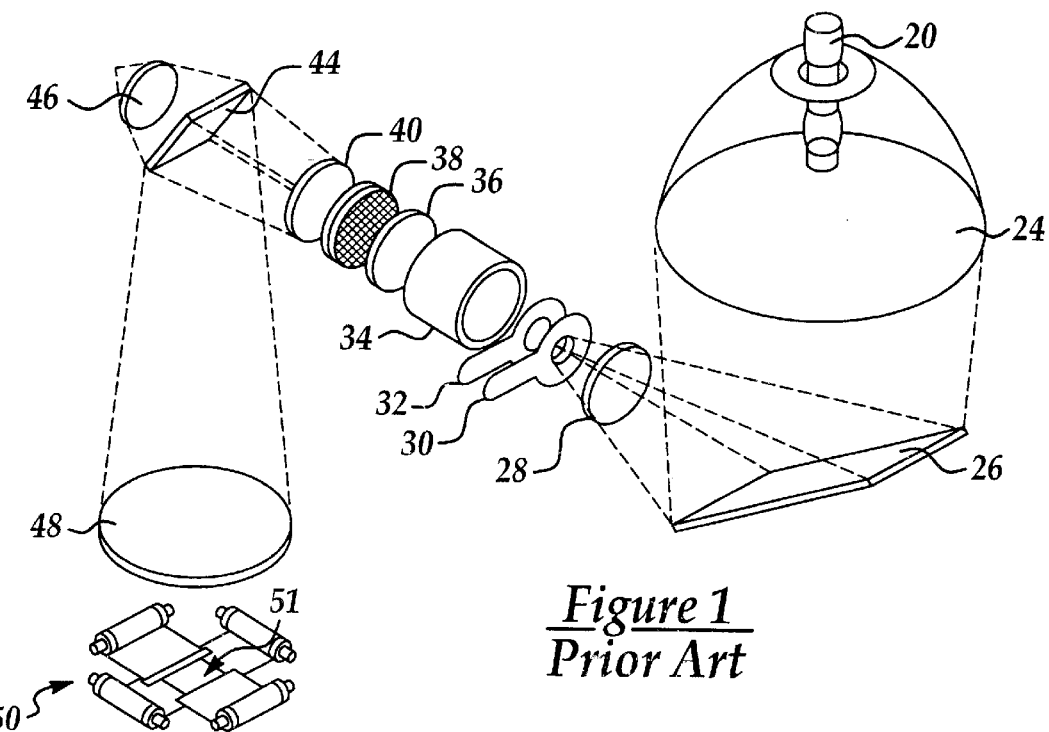
FIG. 1 is an illustration of a conventional light source for a photolithographic exposure system.
Figure 2:
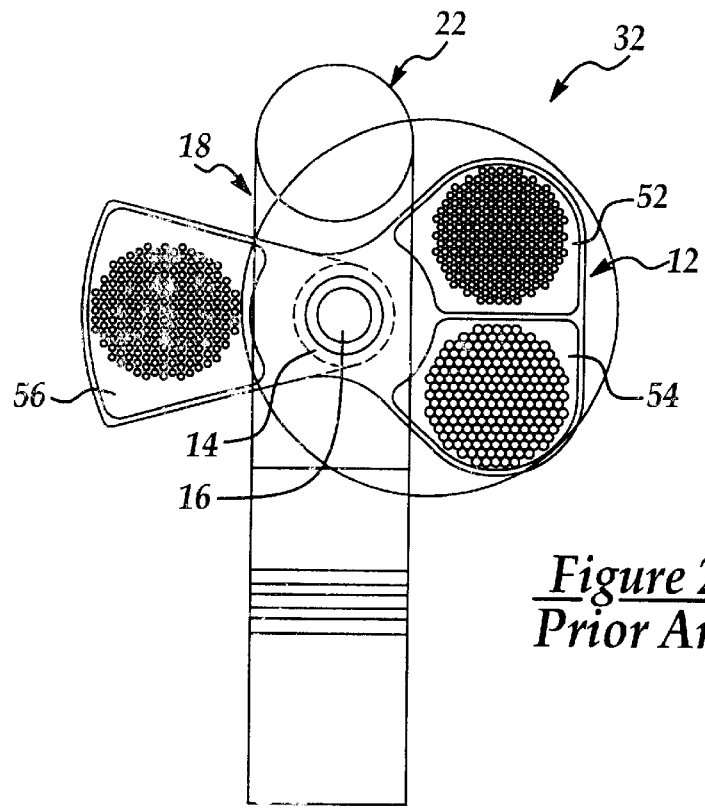
FIG. 2 is a plane view of a conventional attenuator blade mounted over an optical port.
Figure 3:
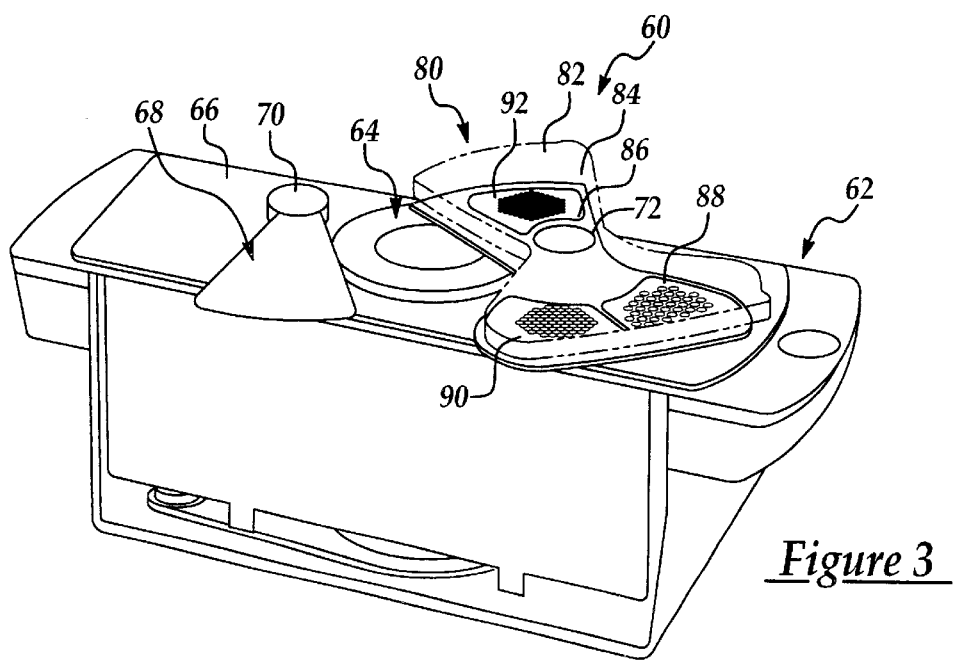
FIG. 3 is a perspective view of the present invention variable attenuator equipped with three attenuator blades each having three attenuators.

Referring now to FIG. 3, wherein a present invention step and scan exposure system 60 is shown. The exposure system 60 consists of a main chamber 62 which contains an optical source (not shown) therein and an optical port 64 in a first chamber wall 66. The optical port 64 is adapted for outputting an optical beam generated by the optical source which is frequently a mercury lamp or a mercury arc lamp. Any other suitable lamp similar to a mercury lamp may also be used. On top of the first chamber wall 66, is mounted a shutter blade 68 on a shaft 70 for rotably engaging the optical port 64 such that the port can be completely blocked by the shutter blade 68 when no optical output is needed from the port 64.

The present invention variable attenuator 80 is further mounted on the first chamber wall 66 on shaft 72. The variable attenuator 80, as shown in FIG. 3 in the preferred embodiment, consists of three attenuator blades, 82, 84 and 86. The top attenuator blade 82, the middle attenuator blade 84 and the bottom attenuator blade 86 wherein each is mounted with three attenuators. For simplicity reasons, only the three attenuators 88, 90 and 92 mounted in the bottom attenuator blade 86 is shown in FIG. 3. The aperture size in each of the attenuators and the number of apertures are different such that each attenuator provides a specific percent light transmission therethrough.

Figure 4:
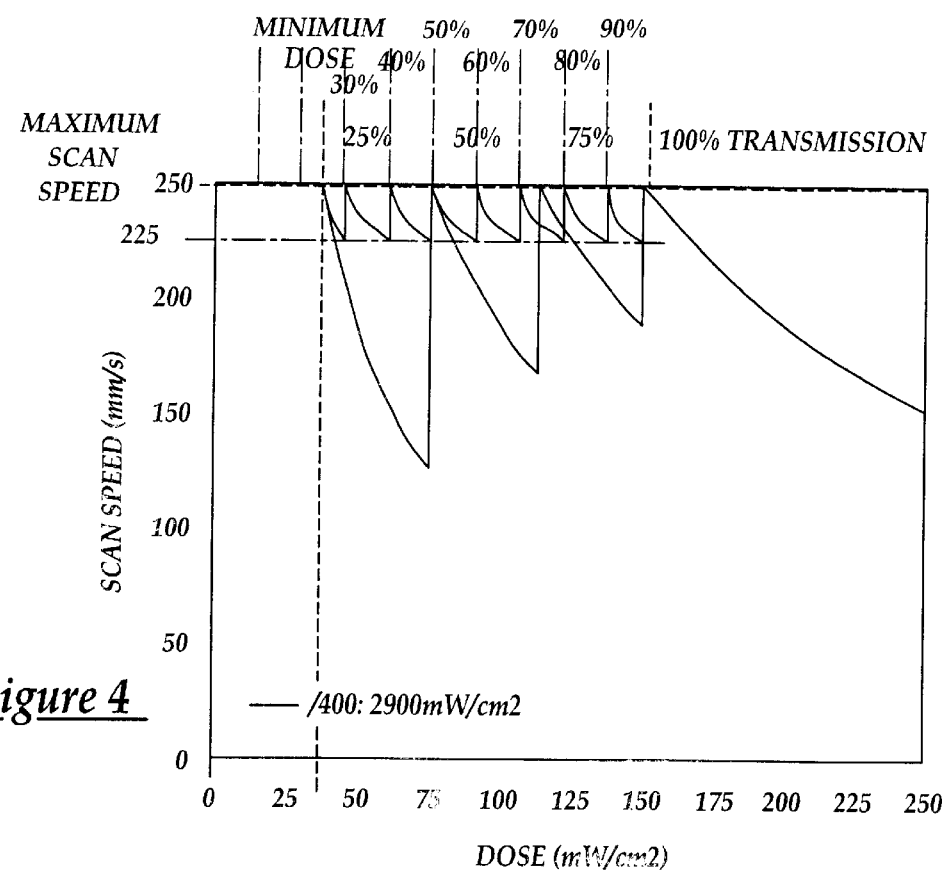
FIG. 4 is a graph illustrating the effect of light attenuation on the scan speed in the conventional system and in the present invention exposure system.

In the preferred embodiment wherein three attenuator blades are utilized, i.e., for providing a total of 9 attenuators, a small increment of 10% light transmission can be achieved by setting the attenuators at 10%, 20%, 30%, 40%, 50%, 60%, 70%, 80% and 90%. The minimal effect on the scan speed of the wafer stage is shown in FIG. 4. In each of the 10% light transmission attenuator, when a percent light transmission in between any two adjacent attenuators is required, a maximum loss in the scan speed is only 10%, i.e. when the scan speed decreased to 225 mm/sec from a standard scan speed of 250 mm/sec. For instance, if a 35% light transmission is desired, the 30% transmission attenuator may be used together with the wafer stage scanning speed slowed down to about 237 mm/sec. A major benefit achieved by the present invention is therefore self-evident, i.e., the scan speed of the wafer stage and therefore the exposure throughput does not have to be sacrificed when a specific level of light transmission is desired.

The plurality of attenuator blades 82, 84 and 86 may be suitably controlled by a motor to rotatably and selectively engage the optical port 64 with a desirable attenuator at the specific percent light transmission. The motor means may be controlled by a process controller of the type that is normally used in controlling such apparatus.

The present invention step and scan exposure system equipped with a plurality of attenuator blades for achieving exposure control has therefore been amply described in the above description and in the appended drawings of FIGS. 3 and 4. It should be noted that while in the preferred embodiment a combination of three attenuator blades each equipped with three attenuators is demonstrated, the present invention novel concept of exposure control can be equally applied in any combination of attenuator blades and attenuators. For instance, each attenuator blade may include four attenuators and a total number of three attenuator blades may be used when a smaller increment than 10% is desired. When the total number of attenuators is doubled, an increment of 5% light transmission can be achieved by the present invention apparatus.

While the present invention has been described in an illustrative manner, it should be understood that the terminology used is intended to be in a nature of words of description rather than of limitation.

Furthermore, while the present invention has been described in terms of a preferred and alternate embodiment, it is to be appreciated that those skilled in the art will readily apply these teachings to other possible variations of the invention.

The embodiment of the invention in which an exclusive property or privilege is claimed are defined as follows:

1. A step and scan exposure system equipped with a plurality of attenuator blades for exposure control comprising:
   a main chamber containing an optical source therein and an optical port in a first chamber wall adopted for outputting an optical beam; and
   at least two attenuator blades mounted on said first chamber wall in a passageway of said optical beam each equipped with at least three attenuators for producing an attenuated optical beam exiting said optical port.

2. A step and scan exposure system equipped with a plurality of attenuator blades for exposure control according to claim 1, wherein said at least two attenuator blades are rotatably mounted on said first chamber wall such that an attenuator is rotatably selected for blocking said passageway of the optical beam in said optical port.

3. A step and scan exposure system equipped with a plurality of attenuator blades for exposure control according to claim 2, wherein said three attenuator blades being equipped with a total of nine attenuators for providing an optical transmission between 10% and 90% at 10% increment.

4. A step and scan exposure system equipped with a plurality of attenuator blades for exposure control according to claim 1, wherein said object traverses under said optical beam is a semiconductor wafer.

5. A step and scan exposure system equipped with a plurality of attenuator blades for exposure control according to claim 1, wherein said traversing means is a x-y traversing table.

6. A step and scan exposure system equipped with a plurality of attenuator blades for exposure control according to claim 1, wherein said traversing means is a x-y traversing table.

7. A step and scan exposure system equipped with a plurality of attenuator blades for exposure control according to claim 1, wherein said optical sources is a mercury lamp.

8. A step and scan exposure system equipped with a plurality of attenuator blades for exposure control according to claim 1 further comprising a motor means for rotating and selecting an attenuator from said plurality of attenuator blades co-axially mounted on a common shaft.

9. A photolithographic scanner equipped with a variable attenuator comprising:

a scanner body equipped with a light source in said body and an optical port in a top panel for outputting an optical beam from said light source; and a plurality of attenuator blades co-axially mounted thorough a center aperture in each of said blades to said top panel juxtaposed to said optical port, each of said plurality of attenuator blades having at least two attenuators mounted therein for rotatably engaging said optical port and attenuating said optical beam.

10. A photolithographic scanner equipped with a variable attenuator according to claim 9, where in said light source is a mercury arc lamp.

11. A photolithographic scanner equipped with a plurality of attenuator blades for exposure control according to claim 9, wherein said at least two attenuators being formed integrally with each of said plurality of attenuator blades.

12. A photolithographic scanner equipped with a plurality of attenuator blades for exposure control according to claim 9, further comprising a motor means for rotatably engaging said at least two attenuators mounted on each of said plurality of attenuator blades with said optical port to attenuate said optical beam.

13. A photolithographic scanner equipped with a plurality of attenuator blades for exposure control according to claim 9, wherein said plurality of attenuator blades are co-axially mounted to said top panel of the scanner body on a common shaft.

* * * * *